United States Patent
Ko (10) Patent No.: US 7,808,805 B2
(45) Date of Patent: Oct. 5, 2010

(54) COLUMN ADDRESS CONTROL CIRCUIT CAPABLE OF SELECTIVELY ENABLING SENSE AMPLIFIER IN RESPONSE TO COLUMN ADDRESSES

(75) Inventor: Bok Rim Ko, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 175 days.

(21) Appl. No.: 12/005,494

(22) Filed: Dec. 27, 2007

(65) Prior Publication Data

US 2009/0003121 A1   Jan. 1, 2009

(30) Foreign Application Priority Data

Jun. 27, 2007   (KR) .................. 10-2007-0063931

(51) Int. Cl.
*G11C 5/00* (2006.01)
*G11C 7/00* (2006.01)
*G11C 8/00* (2006.01)

(52) U.S. Cl. .............. 365/52; 365/189.05; 365/189.08; 365/230.08; 365/233.1; 365/233.11; 365/233.16; 365/233.17; 365/233.18

(58) Field of Classification Search .............. 365/52, 365/189.05, 189.08, 233.08, 233.13, 233.16, 365/233.17, 233.18, 233.11, 233.1
See application file for complete search history.

(56) References Cited

U.S. PATENT DOCUMENTS

| | | | | |
|---|---|---|---|---|
| 5,682,354 A | | 10/1997 | Manning | |
| 5,991,233 A | * | 11/1999 | Yu | 365/233.18 |
| 6,118,729 A | * | 9/2000 | Hirabayashi et al. | 365/233.13 |
| 6,134,180 A | * | 10/2000 | Kim et al. | 365/233.18 |
| 6,144,617 A | * | 11/2000 | Takai | 365/230.08 |
| 6,359,828 B1 | | 3/2002 | La | |
| 6,477,107 B1 | * | 11/2002 | Lee | 365/233.18 |
| 6,542,433 B2 | | 4/2003 | Ka | |
| 6,563,759 B2 | * | 5/2003 | Yahata et al. | 365/230.08 |
| 6,636,446 B2 | * | 10/2003 | Lee et al. | 365/230.08 |
| 6,785,189 B2 | * | 8/2004 | Jacobs et al. | 365/233.13 |
| 7,057,966 B2 | * | 6/2006 | Kang et al. | 365/230.08 |
| 7,085,192 B2 | * | 8/2006 | Fujisawa et al. | 365/230.08 |
| 7,120,083 B2 | * | 10/2006 | Ko | 365/230.08 |

FOREIGN PATENT DOCUMENTS

JP   H07-045069   2/1995

* cited by examiner

*Primary Examiner*—Trong Phan
(74) *Attorney, Agent, or Firm*—John P. White; Cooper & Dunham LLP (57) ABSTRACT

A column address control circuit comprises a control unit for outputting a control signal in response to a DDR mode signal and a first signal, and an address counting unit configured to receive a start column address and output a start column address in response to the control signal. The first signal is a burst read single write mode signal. The control signal is activated when the first signal is activated in a DDR mode. The control unit includes a first logic unit for performing an AND operation of the DDR mode signal and the first signal, and a second logic unit for performing an OR operation of an output signal of the first logic unit and a SDR mode signal.

17 Claims, 7 Drawing Sheets

COLUMN ADDRESS CONTROL CIRCUIT CAPABLE OF SELECTIVELY ENABLING SENSE AMPLIFIER IN RESPONSE TO COLUMN ADDRESSES

BACKGROUND

The present disclosure relates to a semiconductor memory device and, more particularly, to a column address control circuit in a semiconductor memory device.

Generally, a semiconductor memory such as a SDRAM (Synchronous Dynamic Random Access Memory), which supports a DDR (Double Data Rate) or SDR (Single Data Rate) mode, has a cell structure of even and odd blocks in order to be suitable for a DDR characteristic in which data reading/writing operations are performed at an rising edge of a clock and/or a falling edge of the clock. Typically, the number of even blocks is the same as that of odd blocks.

Address lines are connected to each of the even and odd blocks, and an address counter is connected to each address line.

An even address and an odd address are respectively input to the even and odd blocks through the address counter so that a column is selected in response to a read command for reading out data or a write command for writing data. The even and odd addresses are decoded by column decoders of the even and odd blocks to select a column.

At this time, a length of data processed in the selected column in the read or write operation of the semiconductor memory, is generally called a burst length (BL).

For example, in a case that the BL is 4, when a start address to designate a requested column, in which the data read or write operation starts, is provided from the outside, three additional column addresses are further provided from the internal circuit itself so that the read or write operation is possible on the four data.

That is, for the sequential burst mode having the burst length of 4 and a requested column address of 5, the data words (width of the SDRAM) are accessed in the order of 5, 6, 7 and 4.

Meanwhile, in the conventional SDR SDRAM, the read and write operations are performed on a basis of a burst mode. In a case that a specific address is applied in a high level when a MRS (Mode Register Set) command is applied, the read operation is performed in the burst mode, but the write operation is performed based on one bit data. This is called a BRSW (burst read single write) mode.

However, in the DDR SDRAM, a basic operation is performed based on the burst length of 2 by processing the write operation at the rising and falling edges of a clock. The burst read single write mode, which is supported in the SDR SDRAM, is not prescribed in the specification of the DDR SDRAM.

SUMMARY

According to an aspect of the present disclosure, there is provided a column address control circuit which comprises a control unit for outputting a control signal in response to a DDR mode signal and a first signal, and an address counting unit configured to receive a start column address and output a column address in response to the control signal. The first signal is a burst read single write mode signal. The control signal is activated when the first signal is activated in a DDR mode. The control unit includes a first logic unit for performing an AND operation of the DDR mode signal and the first signal, and a second logic unit for performing an OR operation of an output signal of the first logic unit and a SDR mode signal. The first signal is a burst read single write mode signal. The address counting unit includes an address transferring unit for transferring the start column address in response to the control signal and a column signal, an output level maintenance unit for maintaining a level of an output signal of the address transferring unit, an address conversion unit for converting an output signal of the output level maintenance unit in response to the control signal and an internal column signal, and a buffer unit for buffering the output signal of the output level maintenance unit. The address counting unit includes an output level fixing unit which fixes a voltage level of the output level maintenance unit in response to the control signal. The address transferring unit includes a logic element for performing a NAND operation of the control signal and the column signal, and a transfer gate for transferring an inverted signal of the start column address in response to an output signal of the logic element. The output level maintenance unit includes a latch circuit which maintains an output signal of the address transferring unit. The address conversion unit includes a logic element for performing a NAND operation of the control signal and the internal column signal, a first transfer gate for transferring an inverted signal of the output level maintenance unit in response to an output signal of the logic element, a latch circuit for maintaining an output signal of the first transfer gate, and a second transfer gate for transferring an output signal of the latch circuit in response to the output signal of the logic element.

According to another aspect of the present disclosure, there is provided a column address control circuit which comprises a control unit for outputting a control signal in response to a DDR mode signal and a first signal, an address transferring unit for transferring a start column address in response to the control signal and a column signal; an output level maintenance unit for maintaining an output signal of the address transferring unit, an address conversion unit for converting an output signal of the output level maintenance unit in response to the control signal and an internal column signal, and a buffer unit for buffering the output signal of the output level maintenance unit. The first signal is a burst read single write mode signal. The control signal is activated when the first signal is activated in a DDR mode. The control unit includes a first logic unit for performing an AND operation of the DDR mode signal and the first signal, and a second logic unit for performing an OR operation of an output signal of the first logic unit and a SDR mode signal. The address transferring unit includes an output level fixing unit which fixes a voltage level of the output level maintenance unit in response to the control signal. The address transferring unit includes a logic element for performing a NAND operation of the control signal and the column signal, and a transfer gate for transferring an inverted signal of the start column address in response to an output signal of the logic element. The output level maintenance unit includes a latch circuit which maintains an output signal of the address transferring unit. The address conversion unit includes a logic element for performing a NAND operation of the control signal and the internal column signal, a first transfer gate for transferring an inverted signal of the output level maintenance unit in response to an output signal of the logic element, a latch circuit for maintaining an output signal of the first transfer gate, and a second transfer gate for transferring an output signal of the latch circuit in response to the output signal of the logic element.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION OF EXEMPLARY EMBODIMENTS

A column address control circuit according to an exemplary embodiment of the present disclosure makes a burst read single write mode supported even in a DDR SDRAM.

First, a circuit which defines a burst length will be described, and then an address counter control circuit according to an exemplary embodiment of the present disclosure is described.

Figure 1:
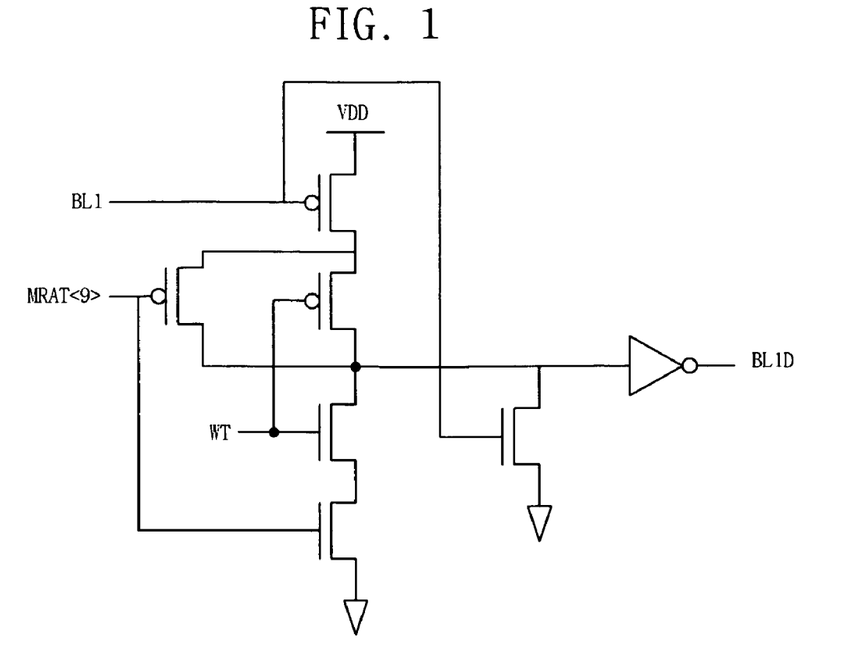
FIG. 1 is a circuit diagram of a burst length controller in a SDR SDRAM.
Figure 2:
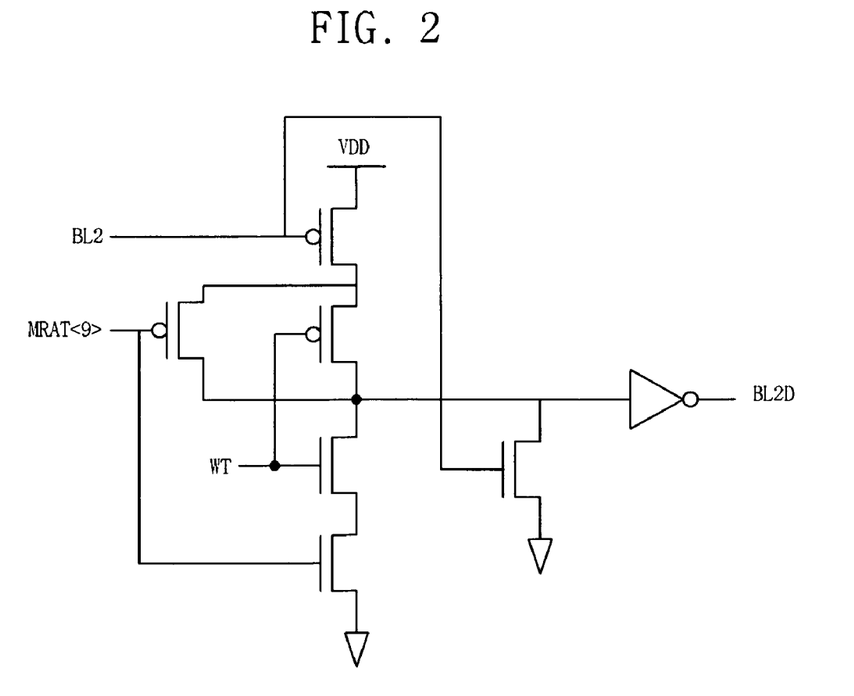
FIG. 2 is a circuit diagram of a burst length controller in a DDR SDRAM.

FIG. 1 is a circuit diagram of a burst length controller in a SDR SDRAM, and FIG. 2 is a circuit diagram of a burst length controller in a DDR SDRAM.

As shown in FIG. 1, in the burst read single write mode, the SDR SDRAM operates in a BL1 mode regardless of a basic BL operation. In the present invention, as shown by way of example in FIG. 2, when the DDR SDRAM is in the burst read single write mode through a burst length controller based on a MRS command, a write operation is performed in a BL2 mode regardless of an established BL, thereby supporting a single write mode in the DDR SDRAM. Here, the reference WT of FIGS. 1 and 2 are write commands for performing the write operation. The reference BL1D of FIG. 1 is a signal for performing the BL1 mode, and the reference BL2D of FIG. 2 is a signal for performing the BL2 mode.

In the burst read single write mode, the read operation is performed in a burst mode but the write operation is performed only in a single mode in a case that a specific address is applied in a high level with a MRS command.

Next, in order to support the burst read single write mode, which is prescribed in the specification of the SDR SDRAM, in the DDR SDRAM, a start address A<0> should be controlled in a column counter circuit.

In a case of the conventional DDR SDRAM, column addresses COL_EV<0> and COL_OD<0> are maintained in a high level because data are written in or read out from cells in the even and odd blocks at the same time. Accordingly, in order to support the burst read single write mode, a method of simultaneously enabling even/odd sense amplifiers is to be changed into a method of enabling only one sense amplifier corresponding to a cell through the control of the column addresses COL_EV<0> and COL_OD<0> so that only one data is written in the cell. The column address control circuit is described in detail below.

Figure 3:
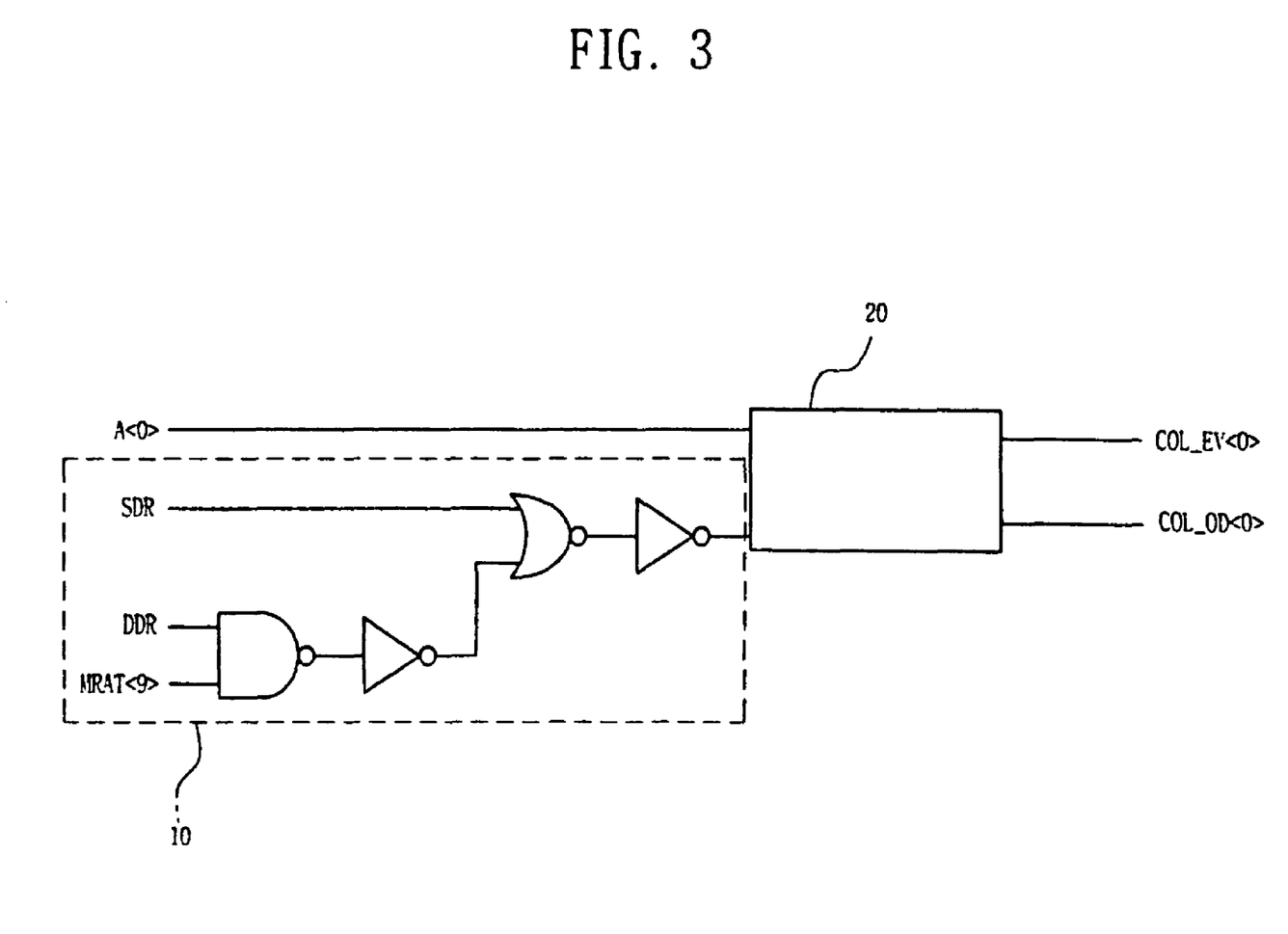
FIG. 3 is a block diagram of a column address control circuit according to an exemplary embodiment of the present disclosure.
Figure 4A:
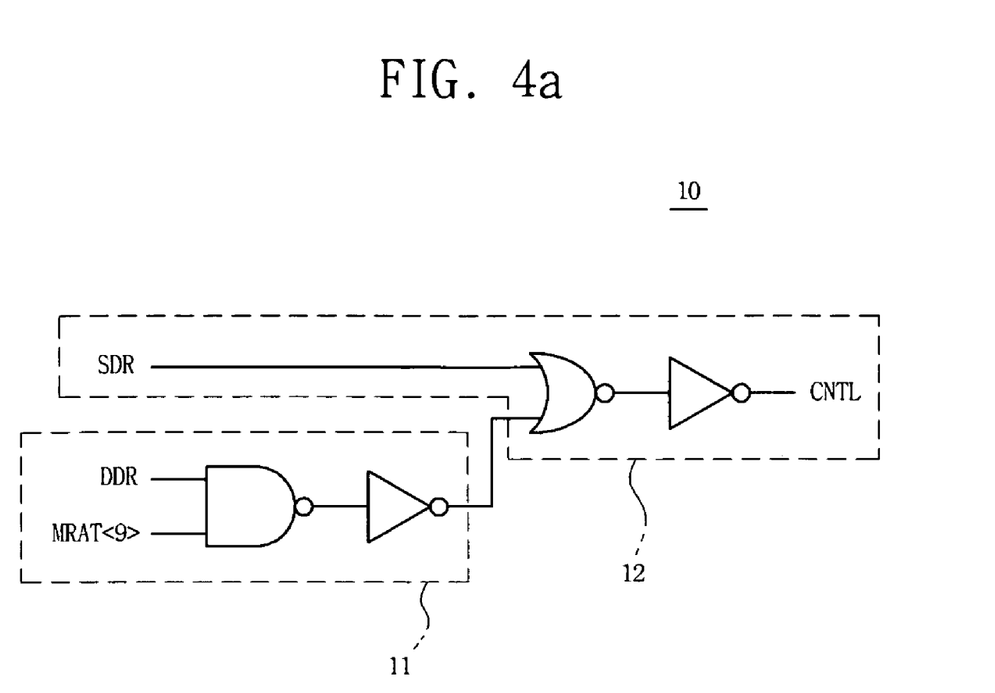
FIGS. 4a, 4b and 4c are detailed circuit diagrams of the circuit shown in FIG. 3.
Figure 4B:
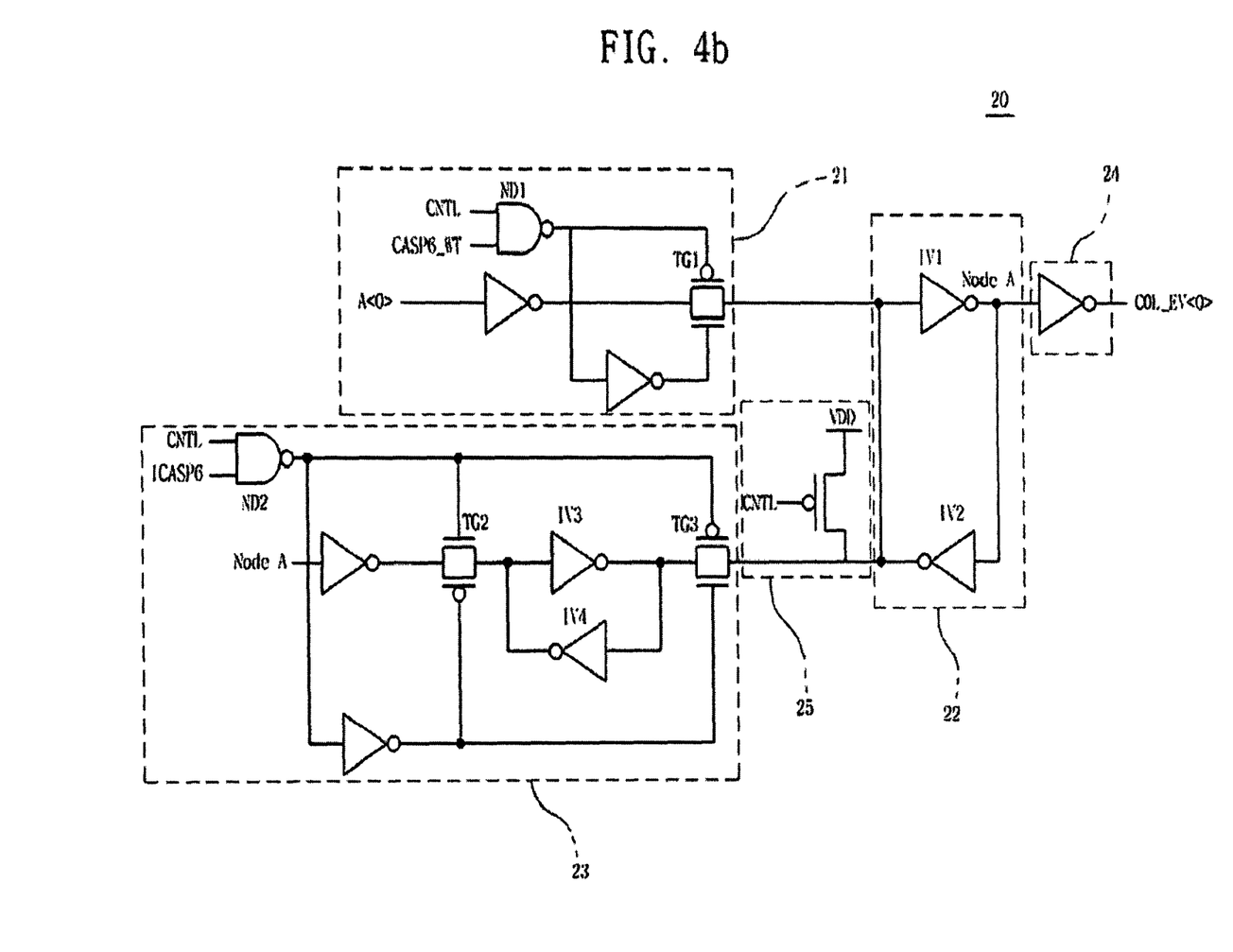
Figure 4C:
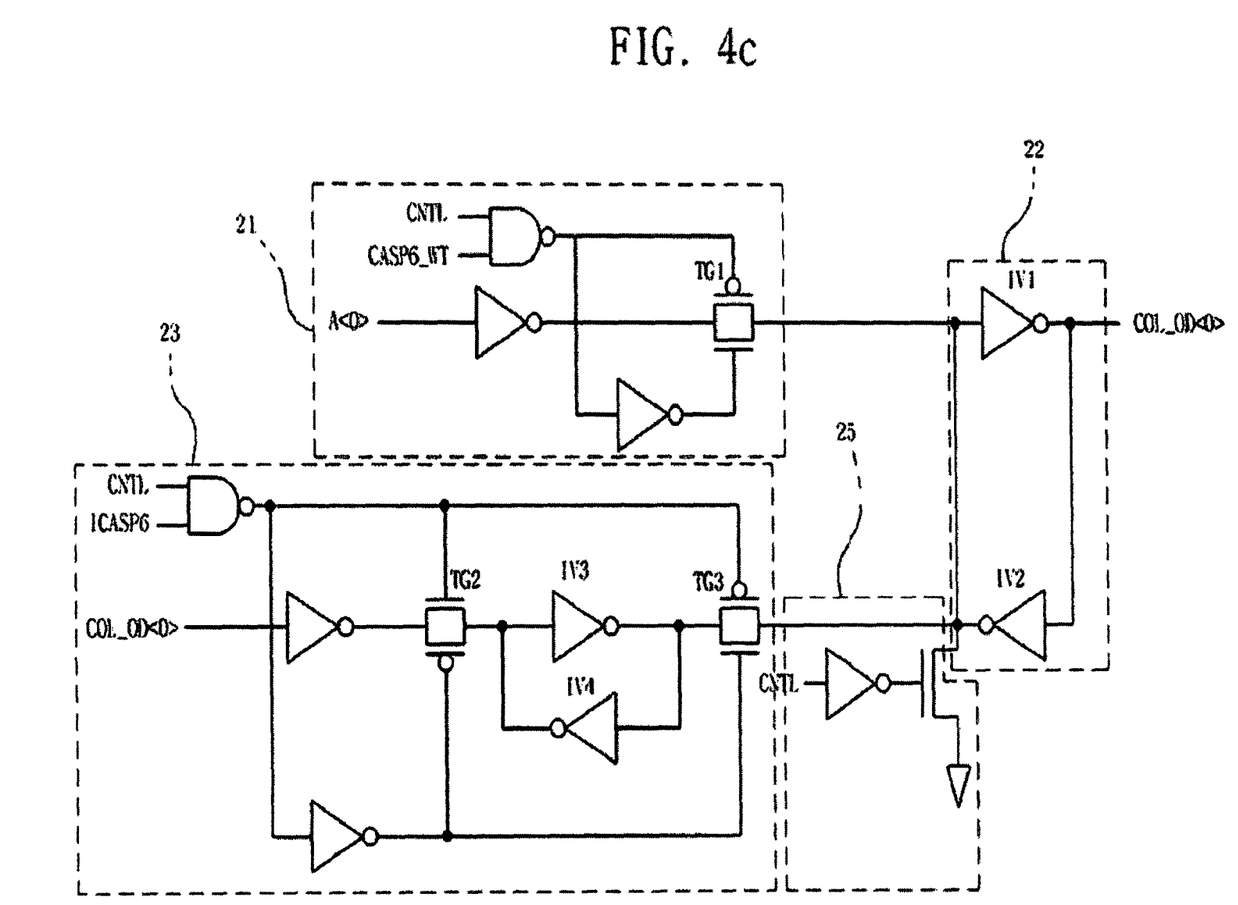

FIG. 3 is a block diagram of a column address control circuit according to a preferred embodiment of the present disclosure, and FIGS. 4a, 4b and 4c are detailed circuit diagrams of the column address control circuit of FIG. 3.

The column address control circuit shown in FIG. 3 includes a control unit 10 for outputting a control signal CNTL in response to a DDR mode signal DDR and a burst read single write mode signal MRAT<9>, and an address counting unit 20 configured to receive the start column address A<0> and output the column addresses COL_EV<0> and COL_OD<0> in response to the control signal CNTL.

Here, in a case of the SDR SDRAM, the start column address A<0> is activated in response to a clock (not shown) by which a write/read command is applied to the memory and, in a case of the DDR SDRAM, the start column address A<0> is activated in response to a clock by which a read command is applied to the memory and is delayed by two clocks as compared with a clock, by which an external command is applied, at the write command.

An external column signal CASP6_WT and an internal column signal ICASP6, shown in FIGS. 4B and 4C, are also activated at the same clock as the start column address A<0>. A SDR mode signal is in a high level in the SDR SDRAM, and a DDR mode signal is in a high level in the DDR SDRAM.

As shown in FIG. 4a, the control unit 10 includes a first logic unit 11 to perform an AND operation of the DDR mode signal DDR and the burst read single write mode signal MRAT<9>, and a second logic unit 12 to perform an OR operation of an output signal of the first logic unit 11 and the SDR mode signal SDR.

The address counting unit 20 includes an even address counting unit and an odd address counting unit. FIG. 4b is a circuit diagram illustrating the even address counting unit and FIG. 4c a circuit diagram illustrating the odd address counting unit.

As shown in FIG. 4b, the even address counting unit includes an address transferring unit 21 which transfers the start column address A<0> in response to the control signal CNTL and the external column signal CASP6_WT, an output level maintenance unit 22 for maintaining an output signal of the address transferring unit 21, and outputting a maintenance signal Node A, an address conversion unit 23 for converting the maintenance signal Node A in response to the control signal CTNL and the internal column signal ICASP6, and a buffer unit 24 for buffering the maintenance signal Node A. Also, the address counting unit 20 further includes an output level fixing unit 25 for fixing a voltage level of the maintenance signal Node A in response to the control signal CNTL.

The address transferring unit 21 includes a logic element ND1 to perform a NAND operation of the control signal CNTL and the column signal CASP6_WT and a first transfer gate TG1 to transfer an inverted signal of the start column address A<0> in response to an output signal of the logic element ND1.

The output level maintenance unit 22 includes a latch circuit (IV1 and IV2) which maintains the output signal of the address transferring unit 21.

The address conversion unit 23 includes a logic element ND2 to perform a NAND operation of the control signal CNTL and the internal column signal ICASP6, a second transfer gate TG2 to transfer an inverted signal of the output level maintenance unit 22 in response to an output signal of the logic element ND2, a latch circuit (IV3 and IV4) which maintains an output signal of the second transfer gate TG2, and a third transfer gate TG3 to transfer an output signal of the latch circuit (IV3 and IV4) in response to the output signal of the logic element ND2.

As shown in FIG. 4c, the odd address counting unit includes an address transferring unit 21' which transfers the start column address A<0> in response to the control signal CNTL and the column signal CASP6_WT, an output level maintenance unit 22' for maintaining an output signal of the address transferring unit 21, an address conversion unit 23' for converting an output signal of the output level maintenance unit 22' in response to the control signal CTNL and the internal column signal ICASP6, and an output level fixing unit 25' for fixing a voltage level of the output signal of the output level maintenance unit 22' in response to the control signal CNTL.

Here, the constitutional difference between the even address counting unit (FIG. 4b) and the odd address counting unit (FIG. 4c) is that the even address counting unit outputs the output signal of the output level maintenance unit 22, as an even address, via the buffer unit 24 which buffers the output signal of the output level maintenance unit 22, while the odd address counting unit outputs the output signal of the output level maintenance unit 22' as an odd address, without buffering.

Also, the output level fixing unit 25 of the even address counting unit applies an external voltage VDD in response to the control signal CNTL, and the output level fixing unit 25' of the odd address counting unit applies a ground voltage VSS in response to the control signal CNTL. Thus, the output signals of the output level maintenance units 22 and 22' are fixed with the external voltage and the ground voltage, respectively.

The operation of the column address control circuit of FIGS. 3 through 4C is described below, with reference to the drawings.

Figure 5:
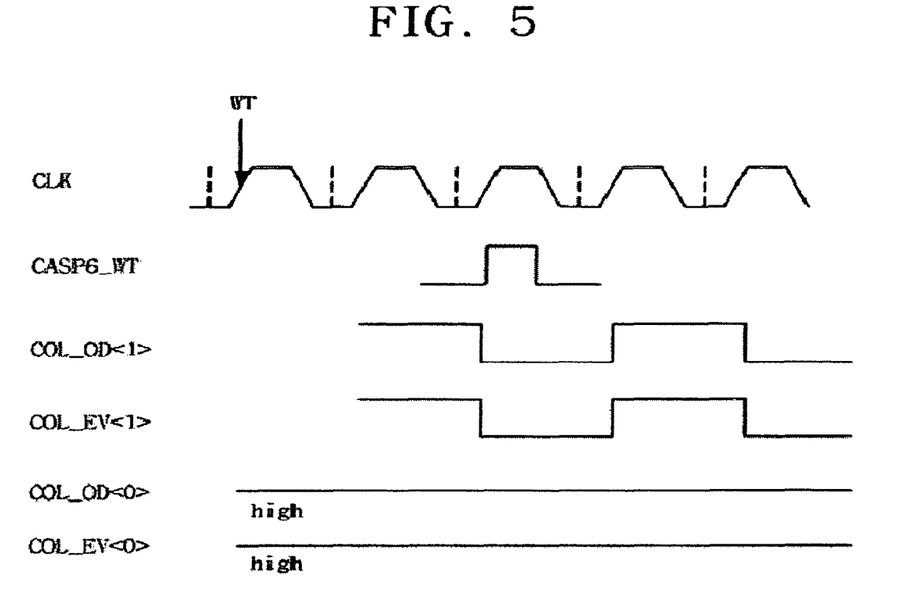
FIG. 5 is a timing view illustrating an operation of a column address counter in a conventional DDR SDRAM.
Figure 6:
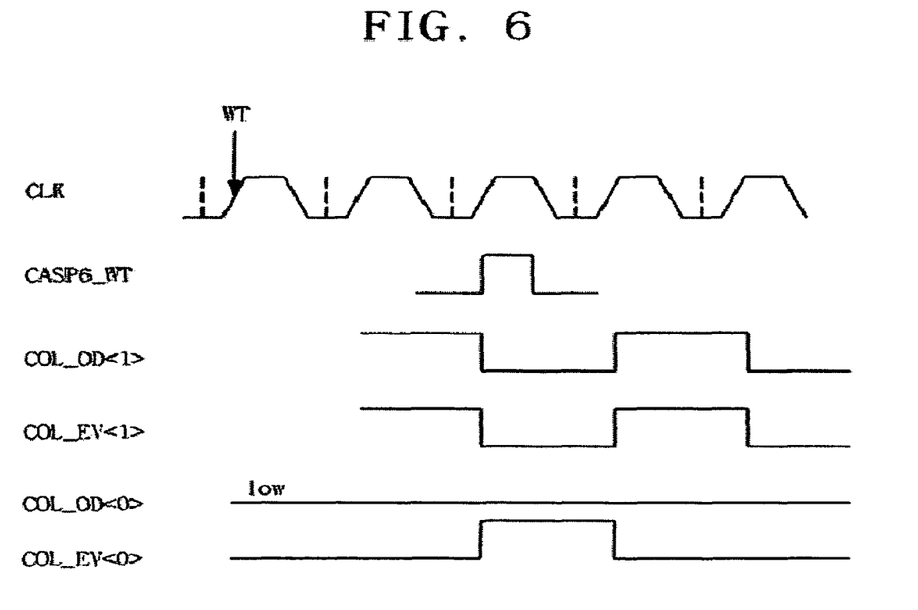
FIG. 6 is a timing view illustrating an operation of the column address control circuit of FIG. 3 when a start column address is 0.
Figure 7:
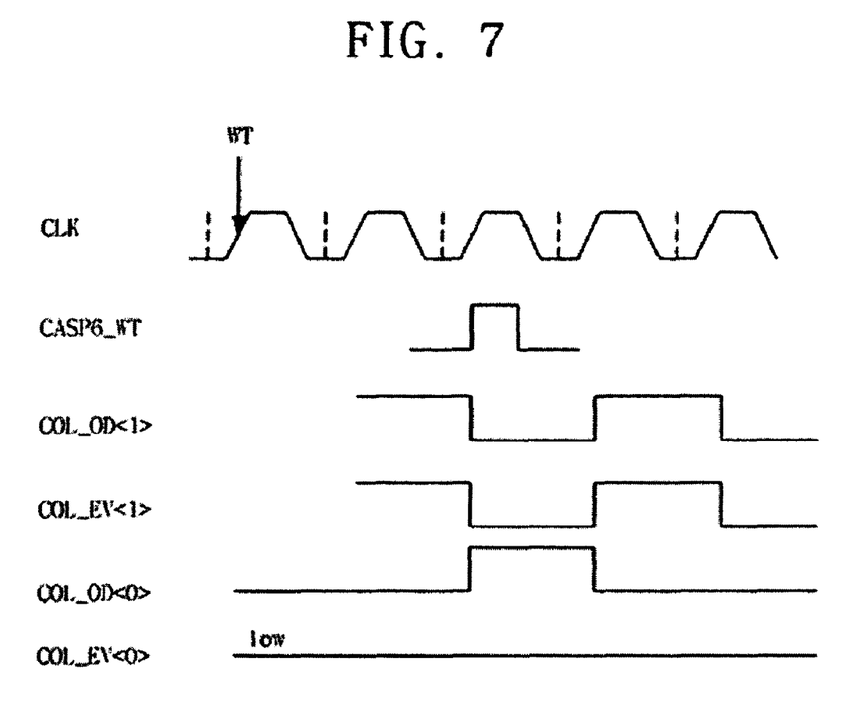
FIG. 7 is a timing view illustrating an operation of the column address control circuit of FIG. 3 when a start column address is 1.

FIG. 5 is a timing view illustrating an operation of a column address counter in a conventional DDR SDRAM, when a start column address is 0, FIG. 6 is a timing view illustrating an operation of the column address control circuit of FIG. 3 when a start column address is 0, and FIG. 7 is a timing view illustrating an operation of the column address control circuit of FIG. 3 when a start column address is 1. Here, the reference high of FIG. 5 indicates the logic level of the column addresses COL EV<0> and COL OD<0>, That is, the reference high of FIG. 5 indicates that the column addresses COL EV<0> and COL OD<0> are the logic level high. The reference low of FIG. 6 indicates the logic level of the column addresses COL OD<0>.

First, referring again to FIG. 4a, the control unit 10 outputs the control signal CNTL through the first logic unit 11 and the second logic unit 12 in response to the DDR mode signal DDR and the burst read single write mode signal MRAT<9>. That is, the control signal CNTL is activated when the burst read single write mode signal MRAT<9> is activated in the DDR mode.

Then, as shown in FIGS. 4b and 4c, the address counting unit 20 receives the start column address A<0> and outputs the column addresses COL_and COL$_{13}$<0> in response to the control signal CNTL.

Specifically, in the address transferring unit 21, the logic element ND1 performs the NAND operation on the control signal CNTL and the column signal CASP6_WT, and the transfer gate TG1 transfers the inverted signal of the start column address A<0> in response to the output signal of the logic element ND1. The output level maintenance unit 22 maintains a voltage level of the output signal of the address transferring unit 21 through the latch circuit (IV1 and IV2).

At this time, the address conversion unit 23 converts the column addresses COL_EV<0> and outputs it through the logic element ND2 which performs the NAND operation of the control signal CNTL and the internal column signal ICASP6, the transfer gate TG2 which transfers the inverted signal of the output level maintenance unit 22 in response to the output signal of the logic element ND2, the latch circuit (IV3 and IV4) which maintains the output signal of the transfer gate TG2, and the transfer gate TG3 which transfers the output signal of the latch circuit (IV3 and IV4) in response to the output signal of the logic element ND2.

As apparent from the above, the present invention supports the burst read single write mode in which only one data is written in the cell of the DDR SDRAM, by selectively enabling a sense amplifier corresponding to a cell in response to the column addresses COL_EV<0> and COL_OD<0> without simultaneously enabling the even/odd sense amplifiers.

The examples and exemplary embodiments referenced above are illustrative, and many variations can be introduced on such examples and exemplary embodiments without departing from the spirit of the disclosure or from the scope of the appended claims.

The present disclosure claims priority to Korean application number 10-2007-0063931, filed on Jun. 27, 2007, the entire contents of which are incorporated herein by reference.

What is claimed is:

1. A column address control circuit, comprising:
   a control unit configured to receive a DDR mode signal for entering a DDR mode operation and a first signal for entering a burst single write mode operation, and configured to output a control signal in response to the DDR mode signal and the first signal; and
   an address counting unit configured to receive the control signal and a start column address for selecting a memory cell, and output a column address in response to the control signal and the start column address,
   wherein the start column address is activated in response to a clock by which a read command is applied, and is delayed by two clocks, as compared with a clock by which a write command is applied in the DDR mode operation.

2. The circuit of claim 1, wherein the first signal is a burst read single write mode signal.

3. The circuit of claim 1, wherein the control signal is activated when a burst read single write mode is activated in a DDR mode.

4. The circuit of claim 1, wherein the control unit includes:
   a first logic unit configured to receive the DDR mode signal and the first signal and perform an AND operation of the DDR mode signal and the first signal; and
   a second logic unit configured to receive an output signal of the first logic unit and a SDR mode signal for entering a SDR mode operation, and perform an OR operation of an output signal of the first logic unit and a SDR mode signal.

5. The circuit of claim 1, wherein the address counting unit includes:
   an address transferring unit configured to receive the control signal and a column signal, and transfer the start column address in response to the control signal and the column signal;
   an output level maintenance unit configured to receive an output signal of the address transferring unit, and maintain the output signal of the address transferring unit;
   an address conversion unit configured to receive the control signal and an internal column control signal, and convert an output signal of the output level maintenance unit in response to the control signal and the internal column signal; and a buffer unit configured to receive and buffer the output signal of the output level maintenance unit.

6. The circuit of claim 5, wherein the address counting unit includes an output level fixing unit configured to receive the control signal and fix a voltage level of the output level maintenance unit in response to the control signal.

7. The circuit of claim 5, wherein the address transferring unit includes:
   a logic element configured to receive the control signal and the column signal and perform a NAND operation of the control signal and the column signal; and
   a transfer gate configured to receive an output signal of the logic element and transfer an inverted signal of the start column address in response to the output signal of the logic element.

8. The circuit of claim 5, wherein the output level maintenance unit includes a latch circuit configured to receive the output signal of the address transferring unit and maintain the output signal of the address transferring unit.

9. The circuit of claim 5, wherein the address conversion unit includes:
   a logic element configured to receive the control signal and the internal column signal, and perform a NAND operation of the control signal and the internal column signal;
   a first transfer gate configured to receive an output signal of the logic element, and transfer an inverted signal of the output level maintenance unit in response to the output signal of the logic element;
   a latch circuit configured to receive the output signal of the first transfer gate and maintain the output signal of the first transfer gate; and
   a second transfer gate configured to receive the output signal of the logic element and transfer an output signal of the latch circuit in response to the output signal of the logic element.

10. A column address control circuit, comprising:
    a control unit configured to receive a DDR mode signal being enabled to enter a DDR mode and a first signal being enabled to enter a burst read single write mode, and output a control signal in response to the DDR mode signal and the first signal;
    an address transferring unit configured to receive the control signal and a column signal, and transfer a start column address for selecting a memory cell in response to the control signal and the column signal;
    an output level maintenance unit configured to receive an output signal of the address transferring unit, and maintain the output signal of the address transferring unit;
    an address conversion unit configured to receive the control signal and an internal column signal, and convert an output signal of the output level maintenance unit in response to the control signal and the internal column signal; and
    a buffer unit configured to receive the output signal of the output level maintenance unit, and buffer the output signal of the output level maintenance unit.

11. The circuit of claim 10, wherein the first signal is a burst read single write mode signal.

12. The circuit of claim 10, wherein the control signal is activated when the first signal is activated in a DDR mode.

13. The circuit of claim 10, wherein the control unit includes:
    a first logic unit configured to receive the DDR mode signal and the first signal, and perform an AND operation of the DDR mode signal and the first signal; and
    a second logic unit configured to receive an output signal of the first logic unit and a SDR mode signal being enabled to enter a SDR mode, and perform an OR operation of the output signal of the first logic unit and the SDR mode signal.

14. The circuit of claim 10, wherein the address transferring unit includes an output level fixing unit configured to receive the control signal and fix a voltage level of the output level maintenance unit in response to the control signal.

15. The circuit of claim 10, wherein the address transferring unit includes:
    a logic element configured to receive the control signal and a column signal, and perform a NAND operation of the control signal and the column signal; and
    a transfer gate configured to receive an output signal of the logic element and transfer an inverted signal of the start column address in response to the output signal of the logic element.

16. The circuit of claim 10, wherein the output level maintenance unit includes a latch circuit configured to receive the output signal of the address transferring unit and maintain the output signal of the address transferring unit.

17. The circuit of claim 10, wherein the address conversion unit includes:
    a logic element configured to receive the control signal and the internal column signal, and perform a NAND operation of the control signal and the internal column signal;
    a first transfer gate configured to receive an output signal of the logic element and transfer an inverted signal of the output level maintenance unit in response to the output signal of the logic element;
    a latch circuit configured to receive an output signal of the first transfer gate and maintain the output signal of the first transfer gate; and
    a second transfer gate configured to receive the output signal of the logic element and transfer an output signal of the latch circuit in response to the output signal of the logic element.

* * * * *